(12) United States Patent
Fukuzo

(10) Patent No.: US 7,356,654 B2
(45) Date of Patent: Apr. 8, 2008

(54) FLEXIBLE MULTI-AREA MEMORY AND ELECTRONIC DEVICE USING THE SAME

(75) Inventor: Yukio Fukuzo, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 337 days.

(21) Appl. No.: 11/074,726

(22) Filed: Mar. 9, 2005

(65) Prior Publication Data

US 2005/0204100 A1    Sep. 15, 2005

(30) Foreign Application Priority Data

Mar. 15, 2004    (JP)    ............... 2004-073617

(51) Int. Cl.
  *G06F 12/00*    (2006.01)
(52) U.S. Cl. ............... 711/149; 711/148; 711/150; 711/153
(58) Field of Classification Search ............ None
  See application file for complete search history.

(56) References Cited

U.S. PATENT DOCUMENTS

| | | |
|---|---|---|
| 3,735,360 A | 5/1973 | Anderson et al. |
| 5,276,842 A | 1/1994 | Sugita |
| 5,459,851 A | 10/1995 | Nakajima et al. |
| 5,581,244 A | 12/1996 | Jokimies et al. |
| 5,768,203 A | 6/1998 | Fuji |
| 5,802,579 A | 9/1998 | Crary |
| 5,845,322 A * | 12/1998 | Leung .................. 711/151 |
| 6,611,853 B2 * | 8/2003 | Graafmans .............. 708/108 |
| 6,671,199 B2 | 12/2003 | Maruyama |
| 6,732,251 B2 * | 5/2004 | Harris et al. ............ 711/203 |

FOREIGN PATENT DOCUMENTS

JP    59-129989    7/1984

OTHER PUBLICATIONS

Louis E. Frenzel, "Dual-Port SRAM Accelerates Smart-Phone Development", Electronic design [online], Feb. 16, 2004 [retrieved on Mar. 27, 2007], retrieved from the internet at http://www.elecdesign.com/Articles/Print.cfm?ArticleID=7322.
Casey Springer, "Multi-Ports Eliminate Baseband Processing Bottlenecks", CommsDesign [online], Sep. 2, 2004, http://www.commsdesign.com/article/printableArticle.jhtml?articleID=30000347.

* cited by examiner

*Primary Examiner*—Kevin L. Ellis
*Assistant Examiner*—Thanh D. Vo
(74) *Attorney, Agent, or Firm*—Young & Thompson

(57) ABSTRACT

A flexible multi-area memory used for an electronic device such as a mobile phone includes a storage area with a given capacity. The storage area has a first area accessed only by a first processor, a second area accessed only by a second processor, and a common area shared by the first and the second processors. The common area has two ports and thereby simultaneously accessible from the first and the second processors. Each capacity of the first, the second, and the common areas can be set arbitrarily.

1 Claim, 10 Drawing Sheets

FLEXIBLE MULTI-AREA MEMORY AND ELECTRONIC DEVICE USING THE SAME

BACKGROUND OF THE INVENTION

1. Field of the Invention

The present invention relates to a flexible multi-area memory and an electronic device using this memory. Particularly, the invention relates to a flexible multi-area memory used for an electronic device having a plurality of processors and facing the necessity of reducing the size and weight, such as a mobile phone with a camera function, which is especially suitable for use in the case where each processor is replaced with a different type of processor, and an electronic device using this memory.

2. Description of Related Art

Electronic devices such as mobile phones face the necessity of reducing the size and weight. Recent mobile phones have a camera function, videophone function, and so on in addition to normal communication functions. Such mobile phones have a communication central processing unit (CCPU) for controlling data communication with a wireless base station, an application central processing unit (ACPU) for processing software of applications such as a camera function and ringing melodies function, and a memory for storing various data.

This type of conventional mobile phone has an antenna 1, a wireless communication section 2, a button operation section 3, a CPU 4, a camera section 5, a digital signal processor (DSP) 6, a static random access memory (SRAM) 7, an arbiter 8, an interface (I/F) 9, a gold/gold ball 10, and a synchronous dynamic random access memory (SDRAM) 11, for example, as shown in FIG. 12. The wireless communication section 2 transmits and receives a wireless electric wave W to and from a wireless base station, which is not shown, via the antenna 1. The button operation section 3 is composed of a transmission key, a conversion key of English/Katakana/Kanji/Number, a power on/off key, a cross key for cursor control, an end key, and so on. The CPU 4 functions as the CCPU and also controls the entire mobile phone.

The camera section 5 is composed of a charge coupled device (CCD) camera or the like to take the image in the vicinity of the mobile phone. The DSP 6 functions as the ACPU and processes the image signal shot by the camera section 5. The SRAM 7 is composed of memory cells each of which has six elements consisting of four transistors and two resistors or consisting of six transistors. The SRAM 7 stores data shared by the CPU 4 and the DSP 6, which is image data having been processed by the DSP 6, for example. The arbiter 8 arbitrates simultaneous access from the CPU 4 and the DSP 6 to the SDRAM 11 via the interface 9 so as to avoid conflict. The gold/gold ball 10 makes contacts between the input/output port of the interface 9 and the input/output port of the SDRAM 11. The SDRAM 11 is a double data rate (DDR) type DRAM composed of memory cells each of which has two elements consisting of one transistor and one capacitor. The SDRAM 11 exchanges data with the CPU 4 or the DSP 6 in synchronization with both rise and fall edges of an external clock signal in order to double the data transfer efficiency without increasing the clock frequency.

This type of technique is also disclosed in Japanese Unexamined Patent Application Publication No. 59-129989 (Ikeda). Ikeda teaches a dual-port dynamic random access memory which is composed of 2T-1C memory cells, each consisting of two transfer gates and one capacitor. Each memory cell has two separated access paths, thereby avoiding the exclusive use of a data bus if suitably operated.

The present invention, however, has recognized that the above memory used for a mobile phone has the following problems.

Since the arbiter 8 arbitrates simultaneous access to the SDRAM 11 by the CPU 4 and the DSP 6, it impedes high-speed processing. Further, the CPU 4 and the DSP 6 have different functions, and the capacity of the SDRAM 11 may be too large or too small for the capacity required for each function, which can cause the SDRAM 11 to fail to store necessary data. Further, if the CPU 4 and the DSP 6 are replaced with different types of processors, it is impossible to set the capacity suitable for each function, which also causes the same problem.

Further, though the memory taught by Ikeda can eliminate the exclusive use of a data bus, it is not compatible with high-speed processing or a capacity corresponding to each function of a plurality of processors.

SUMMARY OF THE INVENTION

According to one aspect of the present invention, there is provided a flexible multi-area memory which includes a storage area with a given capacity having a first area accessed only by a first processor, a second area accessed only by a second processor, and a common area having two ports, shared by the first and the second processors, and simultaneously accessible via the two ports. Each capacity of the first, the second, and the common areas is arbitrarily set.

According to another aspect of the present invention, there is provided an electronic device using the above flexible multi-area memory.

According to still another aspect of the present invention, there is provided a mobile phone using the above flexible multi-area memory.

Since this invention can arbitrarily set each capacity of the first, second, and common areas, it is possible to set a capacity corresponding to each function of the first and second processors. This allows the capacity to be neither too much nor too little for the required capacity. Further, even if the first and second processors are replaced with different types of processors, it is easy to set the capacity corresponding to each function. Furthermore, since the first area is accessed only by the first processor and the second area is accessed only by the second processor, no conflict occurs between the first and second processors, thus permitting high-speed processing.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

A flexible multi-area memory of this invention includes a first area which is accessed only by a first processor, a second area which is accessed only by a second processor, and a common area which is shared by the first and the second processors and which can be simultaneously accessed. The capacity of each area can be set arbitrarily.

Figure 1:
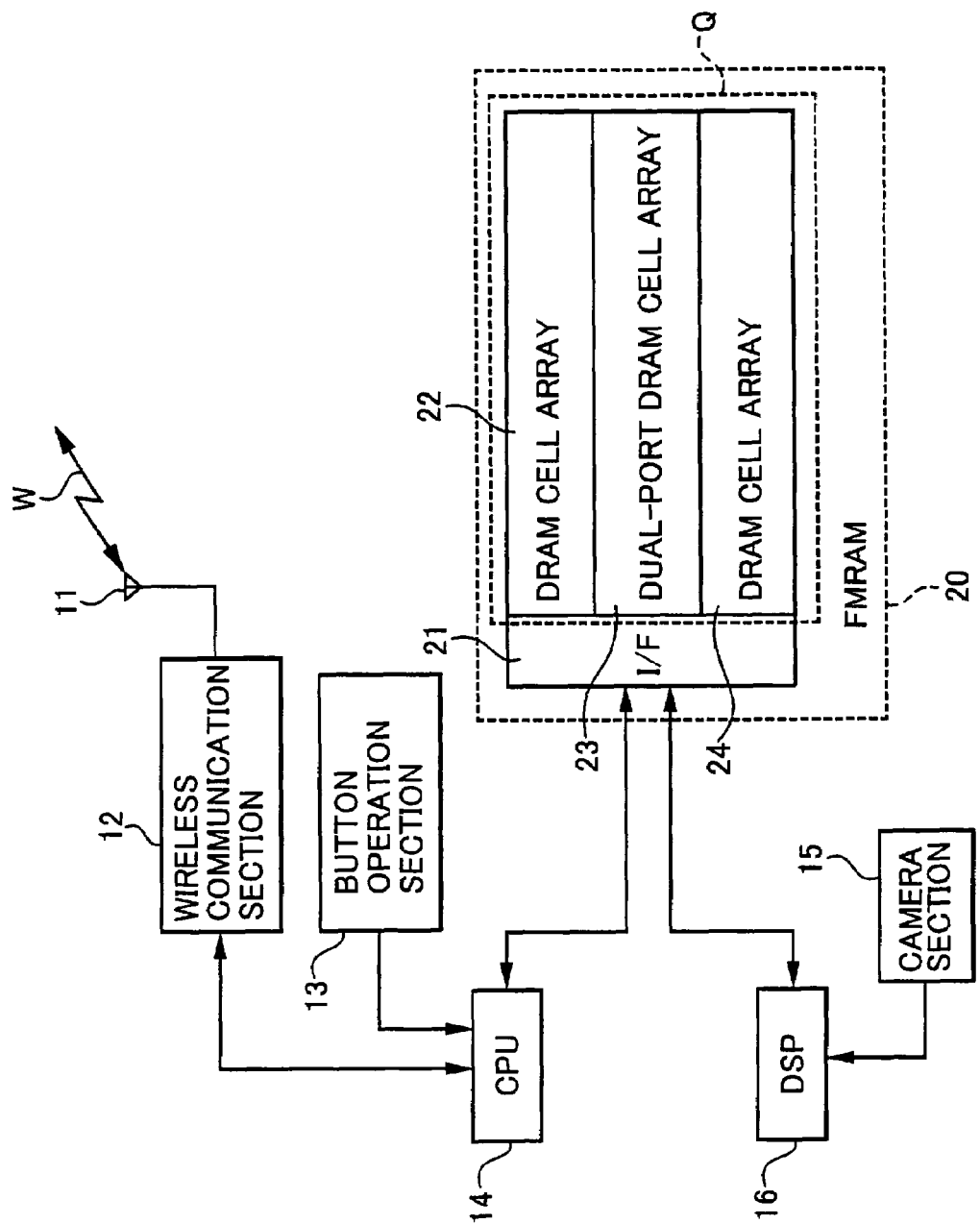
FIG. 1 is a block diagram showing the electric structure of a substantial part of an electronic device using a flexible multi-area memory of an embodiment of the invention.

FIG. 1 shows the electric structure of a substantial part of an electronic device using a flexible multi-area memory of an embodiment of the invention. The electronic device of this example is a mobile phone which includes an antenna 11, a wireless communication section 12, a button operation section 13, a CPU 14, a camera section 15, a DSP 16, and a flexible multi-area random access memory (FMRAM) 20. The wireless communication section 12 transmits and receives a wireless electric wave W to and from a wireless base station, which is not shown, via the antenna 11. The button operation section 13 is composed of a transmission key, a conversion key of English/Katakana/Kanji/Number, a power on/off key, a cross key for cursor control, an end key, and so on. The CPU 14 controls the communication with the wireless base station and also controls the entire mobile phone. The camera section 15 is composed of a CCD camera or the like to take the image in the vicinity of the mobile phone. The DSP 16 processes software of applications such as a camera function and a ringing melodies function. In this embodiment, the DSP 16 processes the image signal shot by the camera section 15.

The FMRAM 20 has a storage area of a given capacity and includes a clock (CLK) synchronous SRAM interface (I/F) 21, a DRAM cell array 22, a dual-port DRAM cell array 23, and a DRAM cell array 24. The CLK synchronous SRAM I/F 21 allows the FMRAM 20, which is based on DRAM memory cells, to operate as a pseudo SRAM (PSRAM). The PSRAM, though based on DRAM memory cells, includes a SRAM-type control section to operate like SRAM. Since it is not necessary to input addresses separately by row address and column address to the PSRAM, there is no need for timing signals such as row address strobe (RAS) and column address strobe (CAS). The PSRAM, just like SRAM, only requires one-time input of an address and it takes in the address triggered by a chip enable signal, which is relevant to a clock of a clock synchronous memory, and reads or writes data.

The DRAM cell array 22 is accessed only by the CPU 14. The dual-port DRAM cell array 23 is shared by the CPU 14 and the DSP 16. The dual-port DRAM cell array 23 has two ports and can be simultaneously accessed by the CPU 14 and the DSP 16 via each port. The DRAM cell array 24 is accessed only by the DSP 16. In this embodiment, the FMRAM 20 is configured to allow arbitrary setting of each capacity of the DRAM cell array 22, the DRAM cell array 24, and the dual-port DRAM cell array 23. The DRAM cell array 22, the dual-port DRAM cell array 23, and the DRAM cell array 24 are incorporated into one chip Q.

Figure 2:
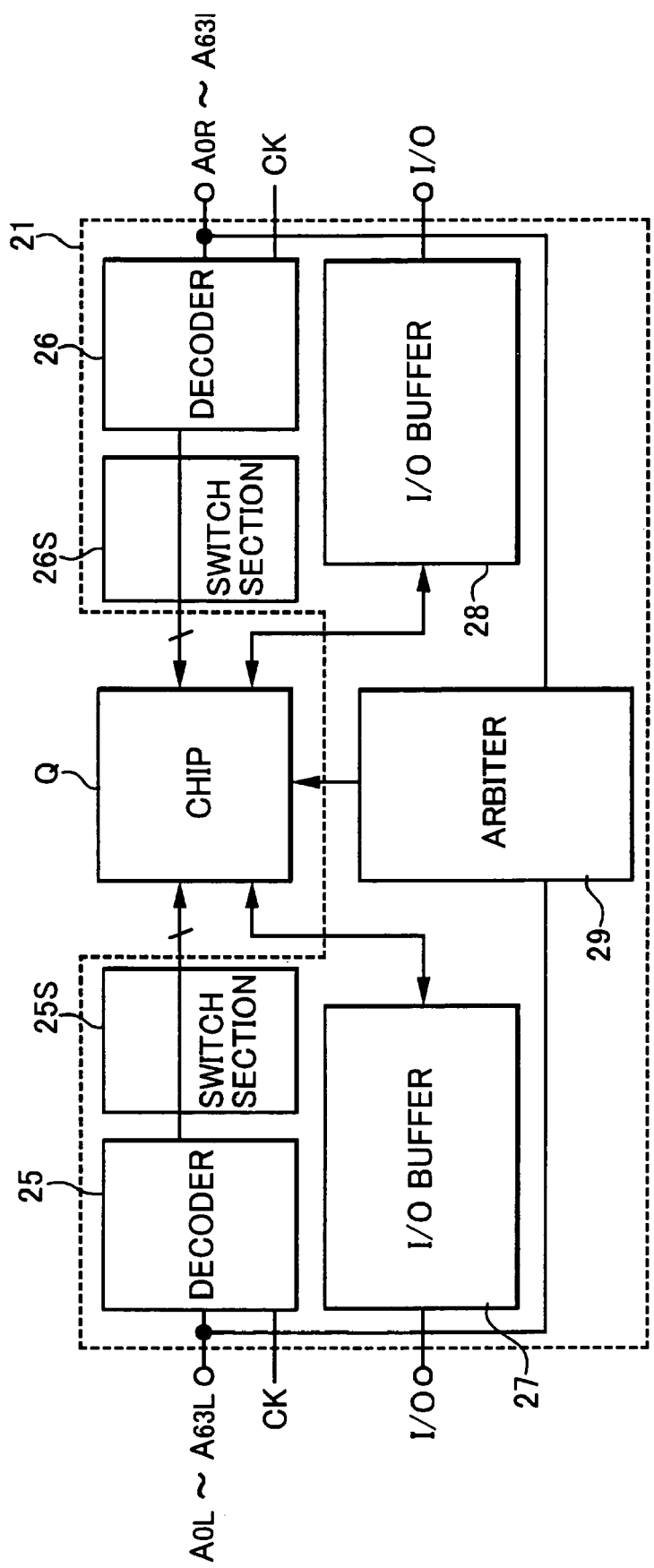
FIG. 2 is a block diagram showing the electric structure of a CLK synchronous SRAM I/F in FIG. 1.

FIG. 2 shows the electric structure of the CLK synchronous SRAM I/F 21 in FIG. 1. The CLK synchronous SRAM I/F 21 includes decoders 25, 26, switch sections 25S, 26S, input/output (I/O) buffers 27, 28, and an arbiter 29. These elements are connected to the chip Q composed of the DRAM cell array 22, the dual-port DRAM cell array 23, and the DRAM cell array 24. The decoder 25 selects the address of one port of a memory cell of the dual-port DRAM cell array 23 or the address of a memory cell of the DRAM cell array 22 via the switch section 25S in synchronization with a clock "ck" according to the access from the CPU 14 or input of address data A0L to A63L. On the other hand, the decoder 26 selects the address of the other port of a memory cell of the dual-port DRAM cell array 23 or the address of a memory cell of the DRAM cell array 24 via the switch section 26S in synchronization with the clock "ck" according to the access from the DSP 16 or input of address data A0R to A63R.

The I/O buffer 27 causes one port of the dual-port DRAM cell array 23 and the DRAM cell array 22 to operate like SRAM and functions as a data I/O interface with the CPU 14. The I/O buffer 28 causes the other port of the dual-port DRAM cell array 23 and the DRAM cell array 24 to operate like SRAM and functions as a data I/O interface with the DSP 16. The arbiter 29 arbitrates simultaneous access from the decoder 25 and the decoder 26 to the dual-port DRAM cell array 23 so as to avoid conflict.

Figure 3:
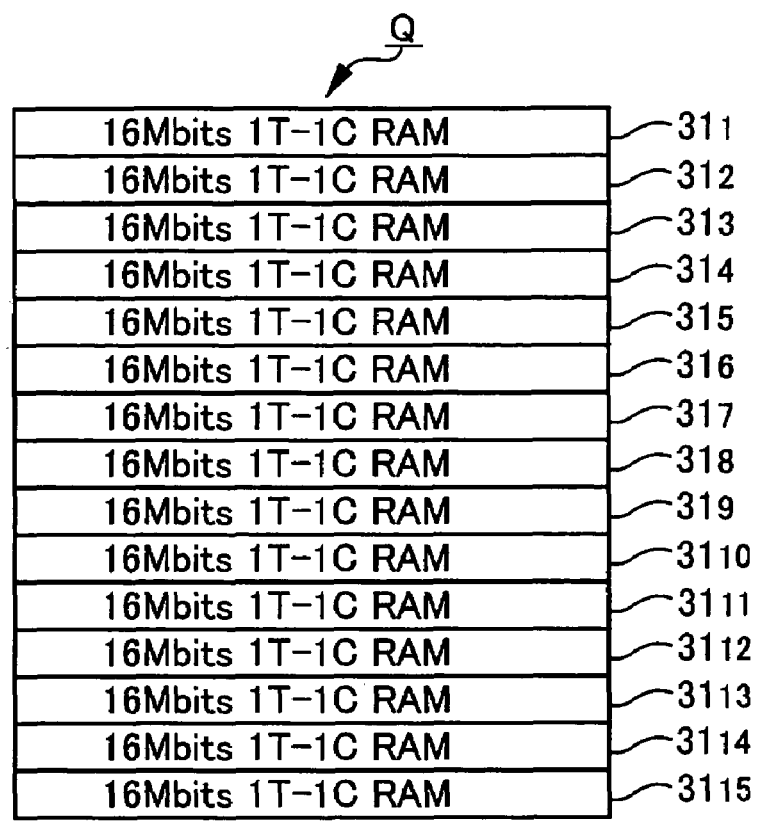
FIG. 3 is a diagram showing a structural example of a chip in FIG. 1.

FIG. 3 shows a structural example of the chip Q in FIG. 1. The chip Q includes memory blocks 311, 312, ... to 3115. The memory block 311 is composed of 1T-1C memory cells, each consisting of a transfer gate and a capacitor. The transfer gate is ON/OFF controlled based on access from the CPU 14 or the DSP 16. The capacitor is charged when the transfer gate is ON to store information. The capacity of the memory block 311 is 16 Mbits, for example. The memory blocks 312 to 3115 have the same structure as the memory block 311.

Figure 4:
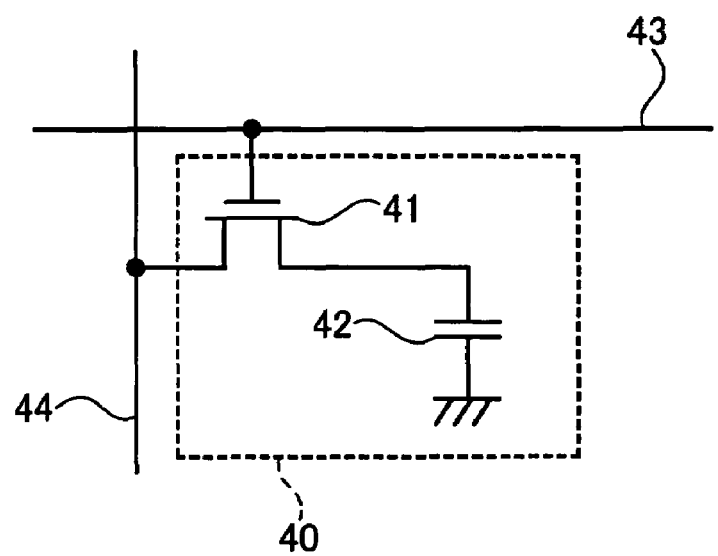
FIG. 4 is a diagram showing the electric structure of a memory cell constituting memory blocks in FIG. 3.

FIG. 4 shows the electric structure of a memory cell constituting the memory blocks 311 to 3115 of FIG. 3. The memory cell 40 has a MOS transistor 41 used as the transfer gate described above and a capacitor 42. The memory cell 40 is placed at a crossing point of a word line 43 and a bit line 44 which is orthogonal to the word line 43. The MOS transistor 41 is turned ON or OFF according to the address data supplied from the decoder 25 or 26 of FIG. 2 through the word line 43. The capacitor 42 is charged when the MOS transistor 41 is ON according to the data supplied from the I/O buffer 27 or 28 of FIG. 2 through the bit line 44 and thereby stores information. In each of the memory blocks 311 to 3115, a memory cell 40 is placed at each crossing point between a plurality of word lines 43 and a plurality of bit lines 44 which are orthogonal to the word lines 43.

Figure 5:
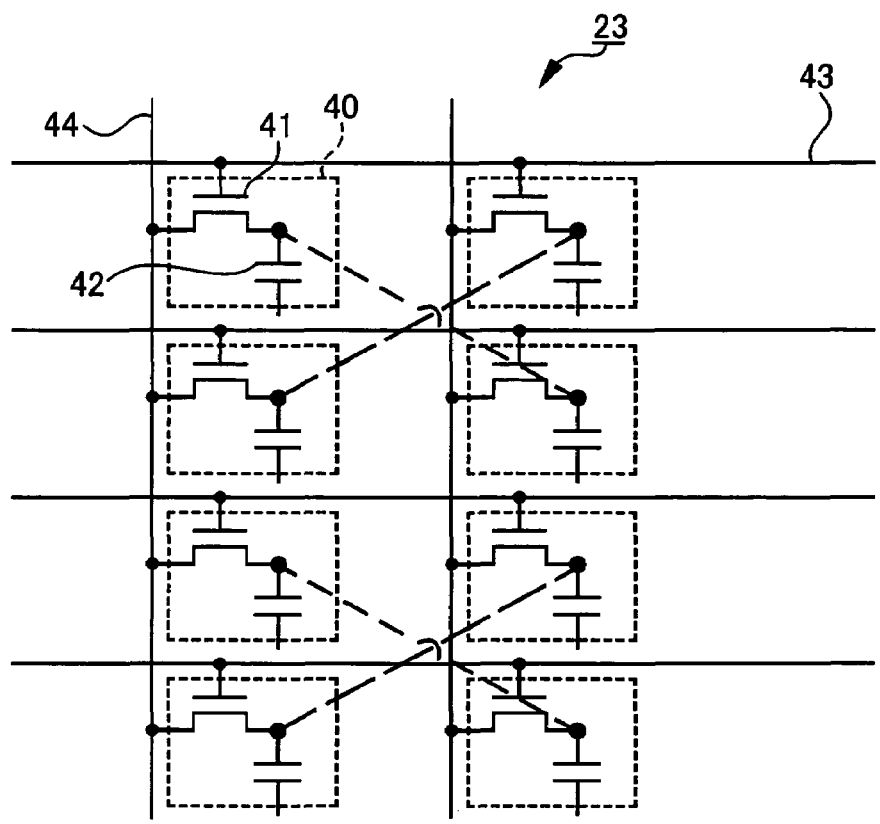
FIG. 5 is a diagram showing the electric structure of a substantial part of a dual-port DRAM cell array in FIG. 1.

FIG. 5 shows the electric structure of a substantial part of the dual-port DRAM cell array 23 in FIG. 1. In the dual-port DRAM cell array 23, the capacitors 42 of two memory cells 40 connected to different word lines 43 and bit lines 44 and located closest to each other are connected in parallel to form a 2T-2C memory cell structure. This connection is made with a line formed by a master slice method, for example.

Figure 6:
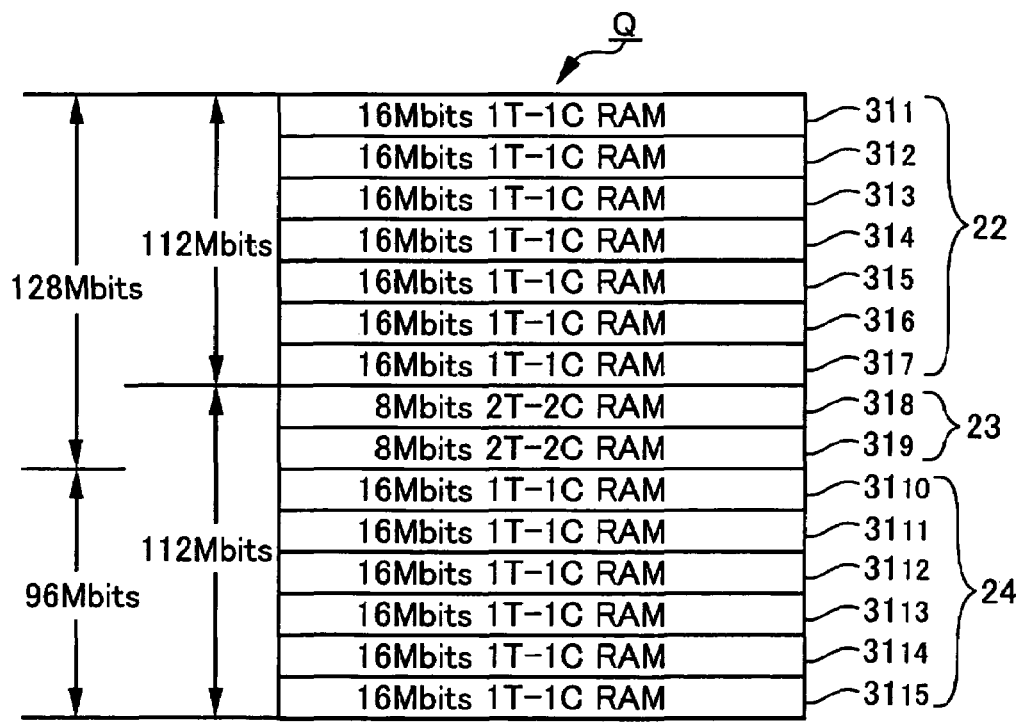
FIG. 6 is a diagram showing the settings of a memory block in FIG. 3.
Figure 7:
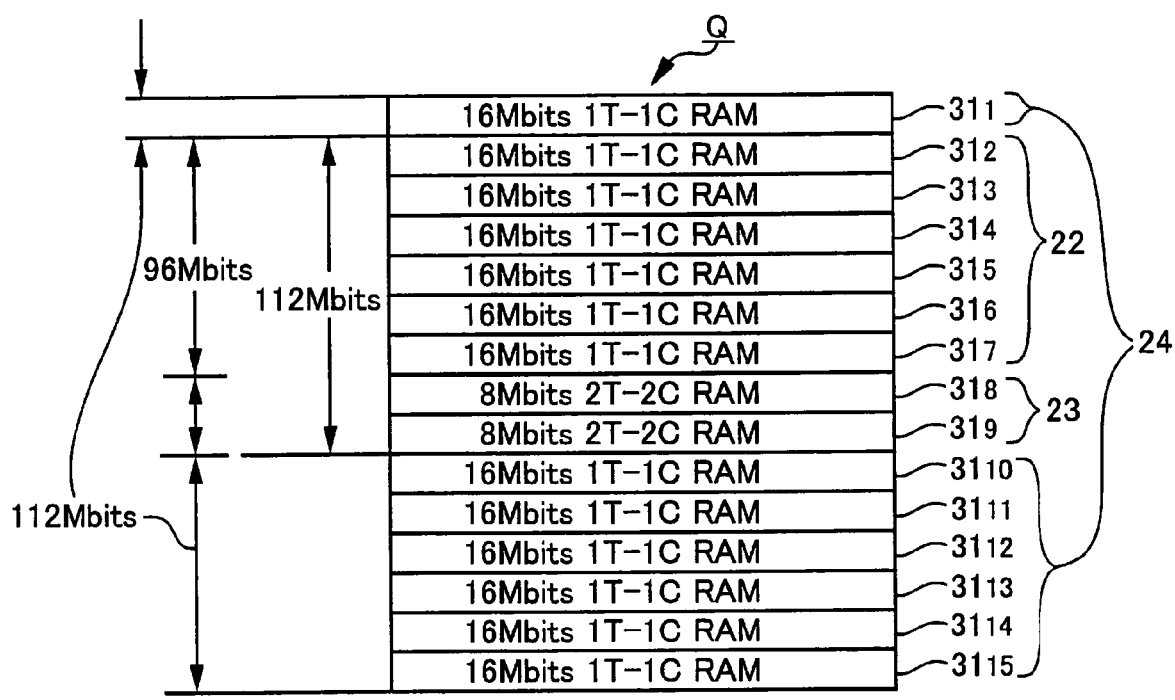
FIG. 7 is a diagram showing the settings of a memory block in FIG. 3.
Figure 8:
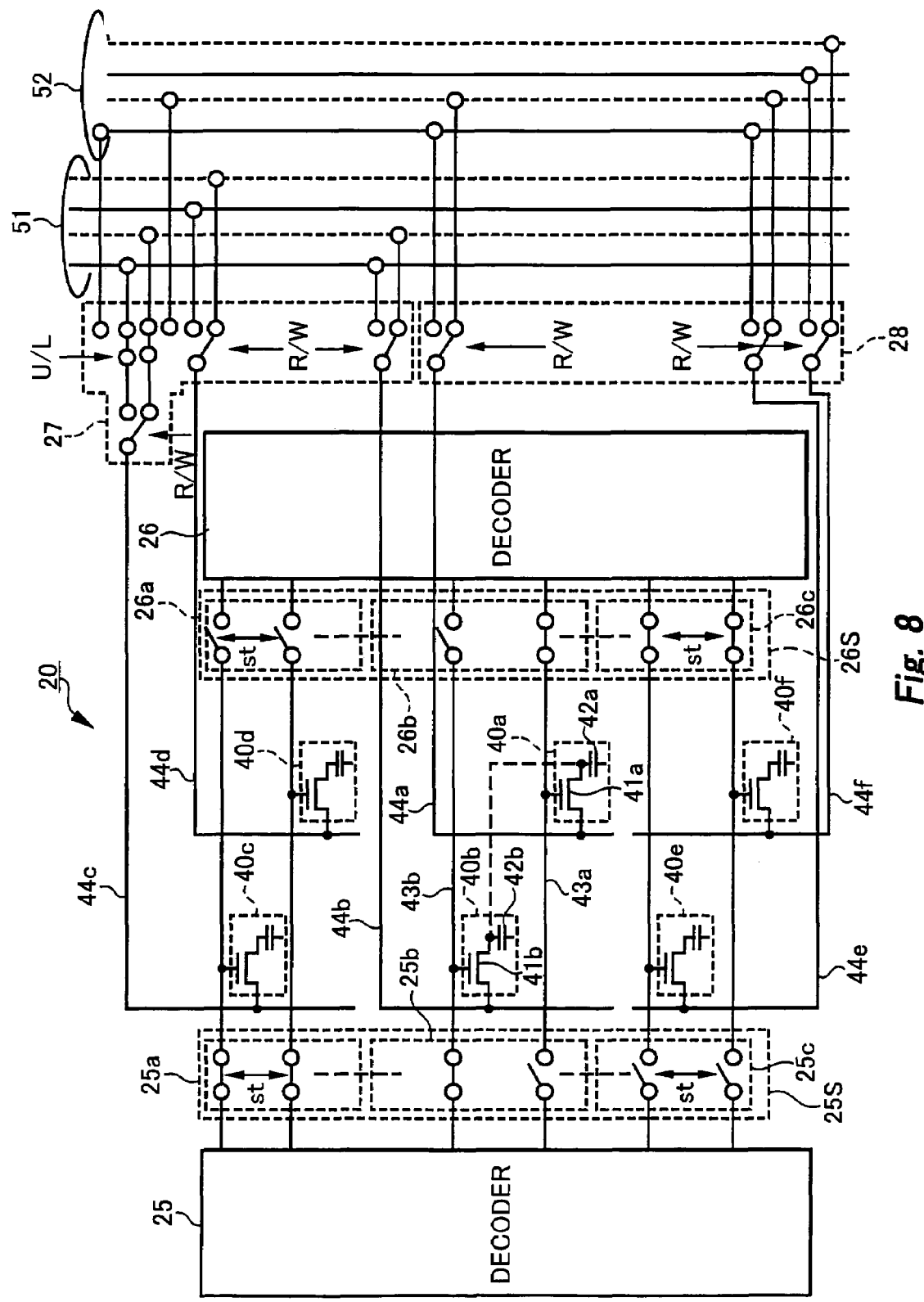
FIG. 8 is a diagram showing the state of a substantial part when writing data to FMRAM.
Figure 9:
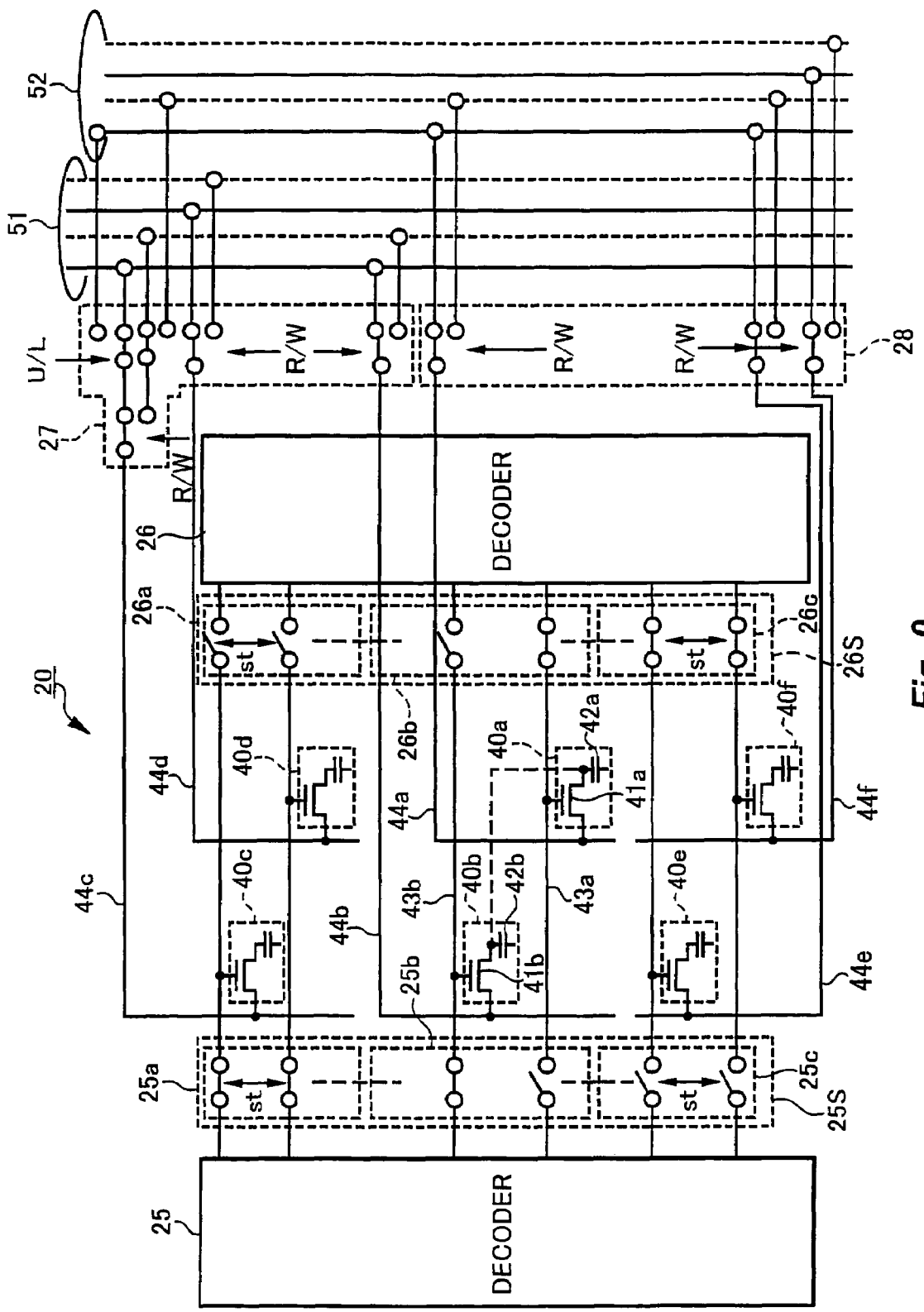
FIG. 9 is a diagram showing the state of a substantial part when reading data from FMRAM.
Figure 10:
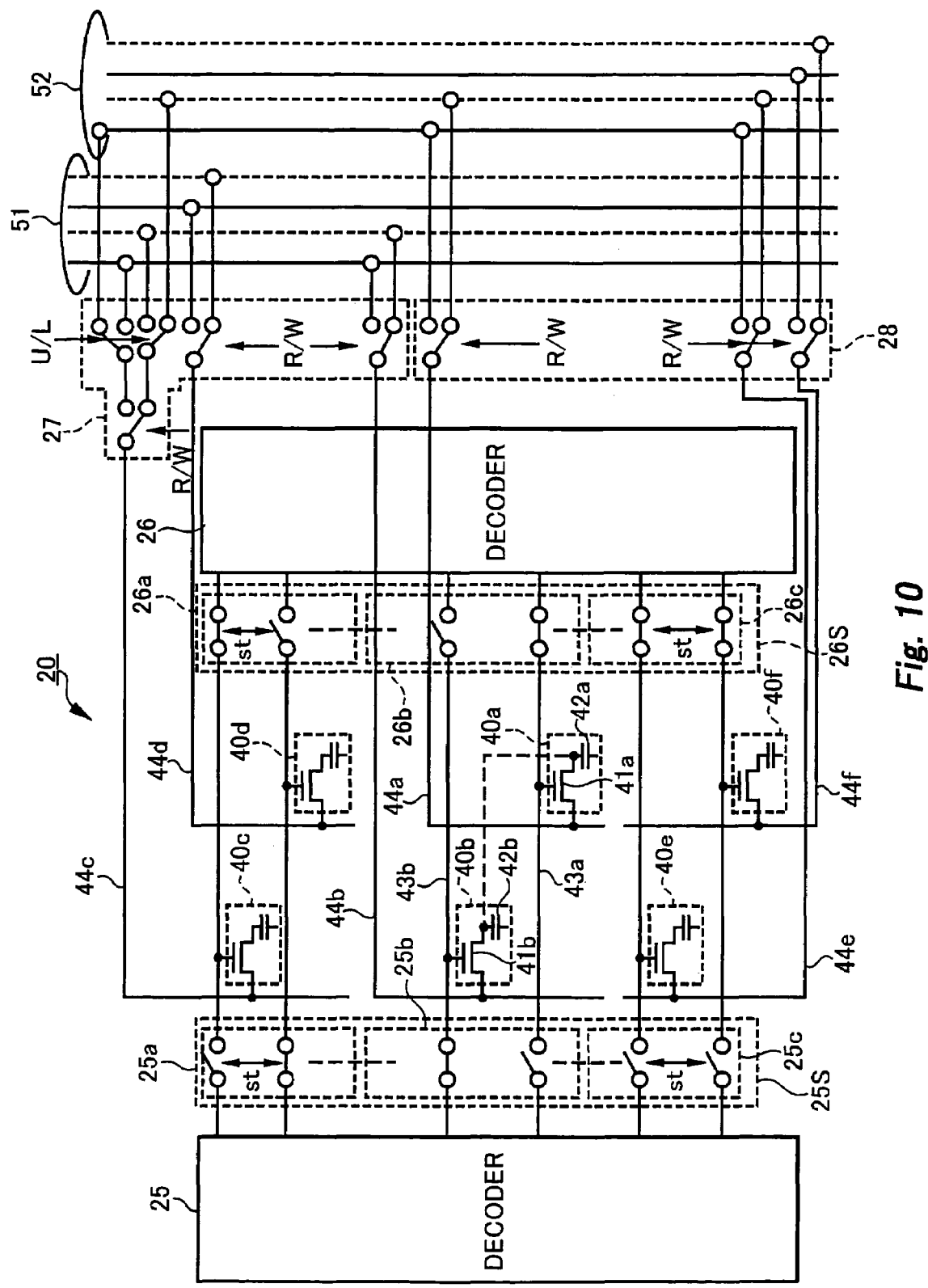
FIG. 10 is a diagram showing the state of a substantial part when writing data to FMRAM.
Figure 11:
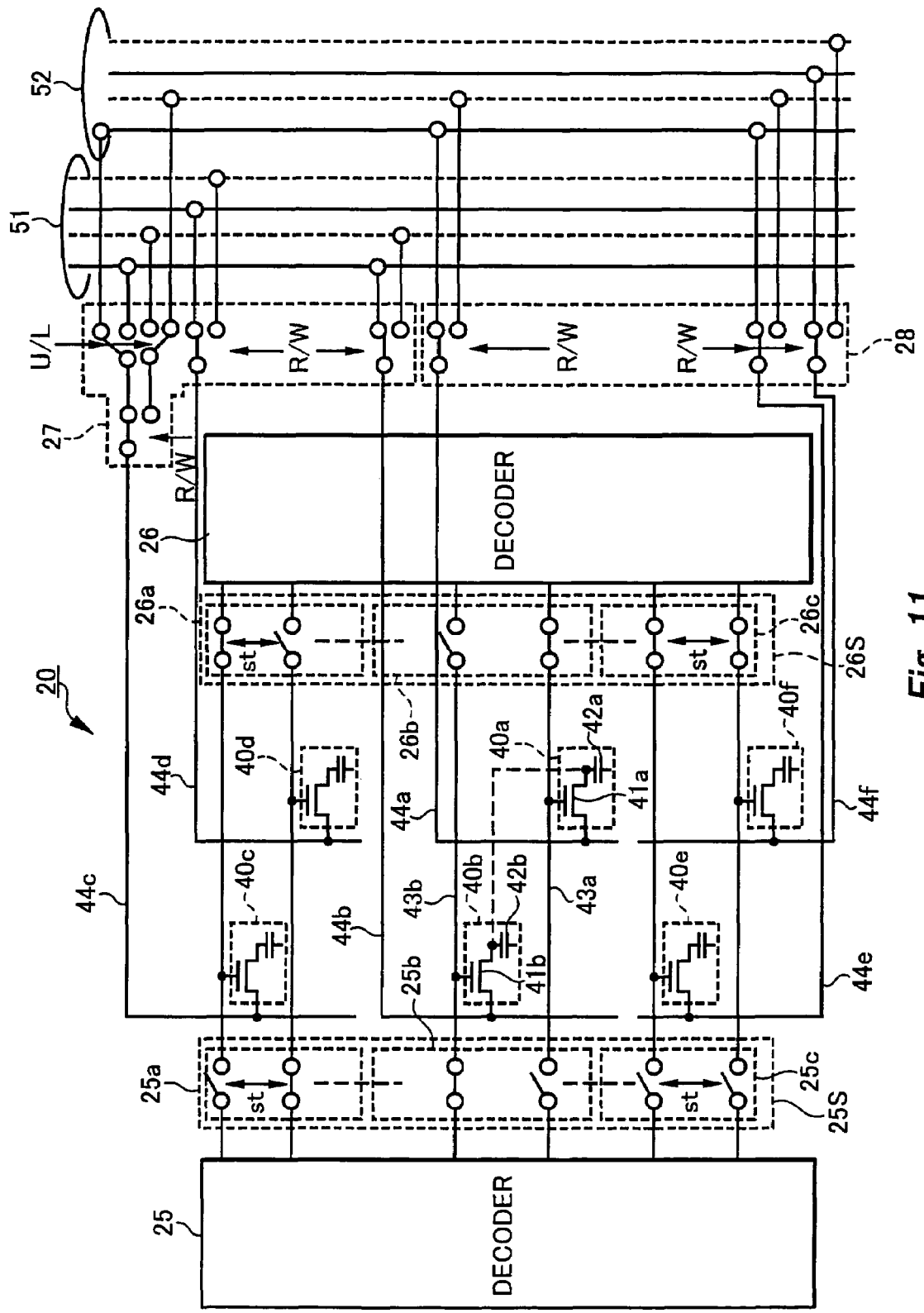
FIG. 11 is a diagram showing the state of a substantial part when reading data from FMRAM.
Figure 12:
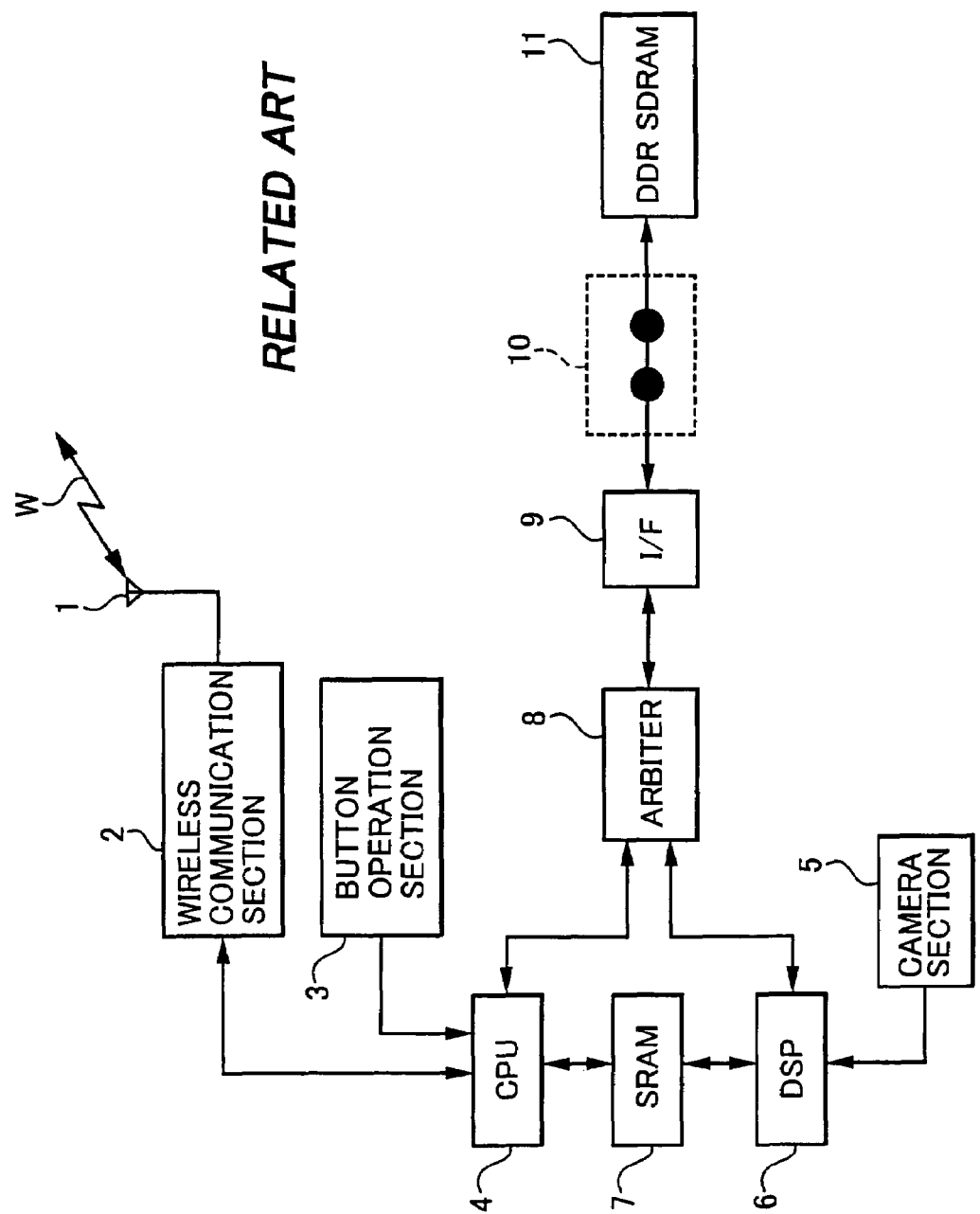
FIG. 12 is a block diagram showing the electric structure of a substantial part of a conventional electronic device.

FIGS. 6 and 7 show the settings of a memory block 31k (k=1, 2, . . . to 15) in FIG. 3. FIG. 8 shows the state of a substantial part when writing data to the FMRAM 20. FIG. 9 shows the state of the substantial part when reading data from the FMRAM 20. FIG. 10 shows the state of the substantial part when writing data to the FMRAM 20. FIG. 11 shows the state of the substantial part when reading data from the FMRAM 20.

Referring to those drawings, the operation of a mobile phone using the flexible multi-area memory of this embodiment is described hereinafter. First, the memory blocks 311 to 317 are set as a 112-Mbit DRAM cell array 22, the memory blocks 318 and 319 are set as a 16-Mbit 2T-2C dual-port DRAM cell array 23 shown in FIG. 5, and the memory blocks 3110 to 3115 are set as a 96-Mbit DRAM cell array 24.

With these settings, the camera section 15 takes a surrounding image, for example, and the DSP 16 processes the image signal. The DSP 16 then makes access to the address of one port of the dual-port DRAM cell array 23 of the FMRAM 20 via the decoder 26 to store the processed image data therein. In this case, switch groups 25a, 25c, 26a, and 26c are turned ON or OFF by a setting signal "st" from a control section, which is not shown, as in FIG. 8, for example. The ON/OFF state of each of switch groups 25b and 26b may be set as manufactured by a line or mask formed by the master slice method, for example.

The switch group 25a is set to ON, corresponding to a memory cell assigned to the DRAM cell array 22, so as to connect this memory cell with the decoder 25. The switch group 26c is set to ON, corresponding to a memory cell assigned to the DRAM cell array 24, so as to connect this memory cell with the decoder 26. The switch group 25b is set to ON, corresponding to a memory cell assigned to the dual-port DRAM cell array 23, so as to connect this memory cell with the decoder 25. The switch group 26b is set to ON, corresponding to a memory cell assigned to the dual-port DRAM cell array 23, so as to connect this memory cell with the decoder 26. Further, in response to a read/write control signal R/W from the control section, a bit line 44a is connected via the I/O buffer 28 to an upper bit write-line, which is shown by a dotted line in an upper line group 52 in FIGS. 8 to 11, and the MOS transistor 41a of the memory cell 40a is turned ON according to the address data supplied from the decoder 26 via the word line 43a, thereby charging the capacitors 42a and 42b of the memory cells 40a and 40b with image data.

Further, in response to an upper/lower switch signal U/L and a read/write control signal R/W from the control section, a bit line 44c is connected via the I/O buffer 27 to a lower bit write-line, which is shown by a dotted line in a lower line group 51 in FIGS. 8 to 11. The CPU 14 makes access to the address of the memory cell 40c of the DRAM cell array 22 via the decoder 25 to write data via the I/O buffer 27. Similarly, in response to a read/write control signal R/W, a bit line 44d is connected via the I/O buffer 27 to a lower bit write-line, and the CPU 14 makes access to the address of the memory cell 40d of the DRAM cell array 22 via the decoder 25 to write data via the I/O buffer 27.

Furthermore, in response to a read/write control signal R/W, bit lines 44e and 44f are connected via the I/O buffer 27 to upper bit write-lines, and the DSP 16 makes access to the addresses of the memory cells 40e and 40f of the DRAM cell array 24 via the decoder 26 to write data via the I/O buffer 28.

When reading out the image data stored in the dual-port DRAM cell array 23, the CPU 14 makes access to the address of the other port of the dual-port DRAM cell array 23 via the decoder 25. In this case, as shown in FIG. 9 for example, in response to a read/write control signal R/W from the control section, a bit line 44b is connected via the I/O buffer 27 to a lower bit read-line, which is shown by a full line in the lower line group 51 in FIGS. 8 to 11. The MOS transistor 41b is turned ON based on the address data supplied from the decoder 25 via a word line 43b, thereby discharging the capacitors 42a and 42b. The image data is then transmitted from the wireless communication section 12 to a wireless base station, which is not shown, by a wireless electric wave W via the antenna 11. If the decoder 25 and the decoder 26 simultaneously access the dual-port DRAM cell array 23, the arbiter 29 arbitrates the access so as to avoid conflict.

Further, in response to an upper/lower switch signal U/L and a read/write control signal R/W, the bit line 44c is connected to the lower bit read-line via the I/O buffer 27. The CPU 14 thereby makes access to the address of the memory cell 40c of the DRAM cell array 22 via the decoder 25 and reads data via the I/O buffer 27. Similarly, in response to a read/write control signal R/W, the bit line 44d is connected to the lower bit read-line via the I/O buffer 27, and the CPU 14 thereby makes access to the address of the memory cell 40d of the DRAM cell array 22 via the decoder 25 and reads data via the I/O buffer 27. Furthermore, in response to a read/write control signal R/W, the bit lines 44e and 44f are each connected to the upper bit read-lines, which are shown by full lines in the upper line group 52 in FIGS. 8 to 11, via the I/O buffer 27. The DSP 16 thereby makes access to the addresses of the memory cells 40e and 40f of the DRAM cell array 24 via the decoder 26 and reads data via the I/O buffer 28.

If the CPU 14 and the DSP 16 are replaced with different types of processors, for example, the memory blocks 312 to 317 are set as a 96-Mbit DRAM cell array 22, the memory blocks 318 and 319 are set as a 16-Mbit 2T-2C dual-port DRAM cell array 23, and the memory blocks 311 and 3110 to 3115 are set as a 112-Mbit DRAM cell array 24 as shown in FIG. 7, for example.

With these settings, the camera section 15 takes a surrounding image and the DSP 16 processes the image signal as describes earlier. The DSP 16 then makes access to the address of one port of the dual-port DRAM cell array 23 of the FMRAM 20 via the decoder 26 to store the processed image data therein. In this case, the switch groups 25a, 25c, 26a, and 26c are turned ON or OFF by a setting signal "st" from the control section, as shown in FIG. 10, for example. The ON/OFF state of switch groups 25b and 26b may be set as manufactured by a line or mask formed by the master slice method, for example.

Further, as shown in FIG. 10, in response to an upper/lower switch signal U/L and a read/write control signal R/W, the bit line 44c is connected to an upper bit write-line via the I/O buffer 27. The DSP 16 thereby makes access to the address of the memory cell 40c of the DRAM cell array 22 via the decoder 26 to write data via the I/O buffer 27. On the other hand, as shown in FIG. 11, in response to an upper/lower switch signal U/L and a read/write control signal R/W, the bit line 44c is connected to an upper bit read-line via the I/O buffer 27. The DSP 16 thereby makes access to the address of the memory cell 40c of the DRAM cell array 22 via the decoder 26 to read data via the I/O buffer 27.

Since this embodiment arbitrarily sets each capacity of the DRAM cell array 22, the DRAM cell array 24, and the dual-port DRAM cell array 23, it is possible to set the capacity corresponding to each function of the CPU 14 and the DSP 16. This allows the capacity to be neither too much nor too little for a required size of capacity. Further, even if the CPU 14 and the DSP 16 are replaced with different types of processors, it is easy to set the capacity corresponding to each function. Furthermore, since the DRAM cell array 22 is accessed only by the CPU 14 and the DRAM cell array 24 is accessed only by the DSP 16, no conflict occurs between the CPU 14 and the DSP 16, thus permitting high-speed processing.

Though an embodiment of the invention is described above in detail with reference to the drawings, specific structures are not limited to those described above. For example, the CPU 14 makes access to the address of the memory cell of the dual-port DRAM cell array 23 or the DRAM cell array 22 via the decoder 25, and the DSP 16 makes access to the address of the memory cell of the dual-port DRAM cell array 23 or the DRAM cell array 24 via the decoder 26 in the above embodiment; however, it is possible to configure the memory blocks 311 to 317 constituting the DRAM cell array 22 in FIG. 6 as bank memories supplied with common address data so that only the bank memory selected by a selection signal is accessed. Similarly, it is possible to configure the memory blocks 3110 to 3115 constituting the DRAM cell array 24 in FIG. 6 as bank memories supplied with common address data so that only the bank memory selected by a selection signal is accessed. Further, though two memory blocks 318 and 319 have the 2T-2C structure in FIG. 6, the number of memory blocks with the 2T-2C structure may vary according to the function of the CPU 14 and the DSP 16. Furthermore, the ON/OFF state of the switch sections 25S and 26S may be contrary to each other in FIGS. 8 to 11.

Although the above embodiments describe the case where this invention is applied to a mobile phone, it is applicable to every electronic device having a plurality of processors and facing the necessity of reducing the size and weight, such as personal digital assistants (PDA). Further, this invention is applicable to every electronic device in which each existing processor is replaced with a different type of processor due to design change.

It is apparent that the present invention is not limited to the above embodiment that may be modified and changed without departing from the scope and spirit of the invention.

What is claimed is:

1. A flexible multi-area memory comprising a storage area with a given capacity, the storage area comprising:

a first area accessed only by a first processor;

a second area accessed only by a second processor;

a common area having two ports, shared by the first and the second processors, and simultaneously accessible via the two ports;

a memory cell array comprising a plurality of memory cells corresponding to the capacity of the storage area;

a first decoder selecting an address of one port of a memory cell assigned to the common area or an address of a memory cell assigned to the first area according to access from the first processor; and a second decoder selecting an address of the other port of the memory cell assigned to the common area or an address of a memory cell assigned to the second area according to access from the second processor, wherein each memory cell comprises a transfer gate ON/OFF controlled according to access from the first processor or the second processor and a capacitor charged when the transfer gate is ON to store information, and each memory cell is located in each crossing point between a plurality of word lines and a plurality of bit lines orthogonal to the word lines, the common area is configured by connecting in parallel capacitors of two memory cells connected to different word lines and bit lines, the first decoder controls ON/OFF of a transfer gate of the memory cell assigned to the first area or the common area, and the second decoder controls ON/OFF of a transfer gate of the memory cell assigned to the second area or the common area.

* * * * *